(12) United States Patent
Toriumi

(10) Patent No.: US 9,548,724 B2
(45) Date of Patent: Jan. 17, 2017

(54) CLOCK GENERATION DEVICE, ELECTRONIC APPARATUS, MOVING OBJECT, AND CLOCK GENERATION METHOD

(71) Applicant: Seiko Epson Corporation, Tokyo (JP)

(72) Inventor: Yuichi Toriumi, Fujimi-machi (JP)

(73) Assignee: Seiko Epson Corporation (JP)

( * ) Notice: Subject to any disclaimer, the term of this patent is extended or adjusted under 35 U.S.C. 154(b) by 210 days.

(21) Appl. No.: 14/219,531

(22) Filed: Mar. 19, 2014

(65) Prior Publication Data

US 2014/0292386 A1 Oct. 2, 2014

(30) Foreign Application Priority Data

Mar. 26, 2013 (JP) .................................. 2013-064186

(51) Int. Cl.
| | | |
|---|---|---|
| H03K 23/66 | (2006.01) | |
| G06F 1/08 | (2006.01) | |
| H03K 3/011 | (2006.01) | |

(52) U.S. Cl.
CPC ................. *H03K 3/011* (2013.01); *G06F 1/08* (2013.01); *H03K 23/662* (2013.01)

(58) Field of Classification Search
CPC ......... H03K 3/011; H03K 23/662; G06F 1/06; G06F 1/08; G06F 1/10
See application file for complete search history.

(56) References Cited

U.S. PATENT DOCUMENTS

| | | | | |
|---|---|---|---|---|
| 8,183,937 | B2 | 5/2012 | McDonald et al. | |
| 8,253,450 | B2 * | 8/2012 | Shibayama | G06F 1/08 |
| | | | | 327/115 |
| 8,369,477 | B2 * | 2/2013 | Shibayama | G06F 1/08 |
| | | | | 377/47 |
| 8,400,202 | B2 * | 3/2013 | Minaki | G06F 1/04 |
| | | | | 327/291 |
| 8,401,136 | B2 * | 3/2013 | Fujiwara | G06F 1/04 |
| | | | | 360/70 |
| 8,422,619 | B2 * | 4/2013 | Shibayama | G06F 1/04 |
| | | | | 327/115 |
| 8,564,336 | B2 * | 10/2013 | Shibayama | G06F 1/06 |
| | | | | 327/115 |
| 2004/0000939 | A1 * | 1/2004 | Meguro | G06F 1/08 |
| | | | | 327/160 |
| 2006/0017510 | A1 | 1/2006 | Momii et al. | |
| 2007/0250735 | A1 | 10/2007 | Momii et al. | |
| 2008/0272947 | A1 * | 11/2008 | Yamaguchi | H03K 5/135 |
| | | | | 341/144 |

FOREIGN PATENT DOCUMENTS

| | | |
|---|---|---|
| JP | 56-169940 A | 12/1981 |
| JP | 2000-315121 A | 11/2000 |
| JP | 2002-228778 A | 8/2002 |
| JP | 2003-270369 A | 9/2003 |
| JP | 2005-328186 A | 11/2005 |
| JP | 2006-039830 A | 2/2006 |
| JP | 4119774 B2 | 7/2008 |

* cited by examiner

*Primary Examiner* — Patrick O'Neill
(74) *Attorney, Agent, or Firm* — Harness, Dickey & Pierce, P.L.C.

(57) ABSTRACT

A clock generation device generates a clock signal which has a predetermined number of clocks for each predetermined time in such a way that a clock signal (32.768 kHz+α (α is zero or a positive number)) is input and some clocks of the clock signal are masked.

17 Claims, 13 Drawing Sheets

| NUMBER OF CLOCKS (N/2) AT 32.768 kHz+α | MEASUREMENT TIME ($T_{meas}$) [ms] | REFERENCE VALUE (F) | NUMBER OF COUNTS AT 25 MHz | MASK NUMBER (K) | CORRECTION TIME ($T_{comp}$) [s] | CORRECTION ACCURACY [ppm] |
|---|---|---|---|---|---|---|
| 64 | 1.7578125 | 48,828 | 43,945 | 4,883 | 1.34 | 20.48 |
| 128 | 3.515625 | 97,656 | 87,890 | 9,766 | 2.68 | 10.24 |
| 256 | 7.03125 | 195,312 | 175,781 | 19,531 | 5.36 | 5.12 |
| 512 | 14.0625 | 390,625 | 351,562 | 39,063 | 10.73 | 2.56 |
| 1024 | 28.125 | 781,250 | 703,124 | 78,126 | 21.46 | 1.28 |
| 2048 | 56.25 | 1,562,500 | 1,406,248 | 156,252 | 42.92 | 0.64 |

FIG. 4

CLOCK GENERATION DEVICE, ELECTRONIC APPARATUS, MOVING OBJECT, AND CLOCK GENERATION METHOD

BACKGROUND

1. Technical Field

The present invention relates to a clock generation device, an electronic apparatus, a moving object, and a clock generation method.

2. Related Art

A Real Time Clock (RTC) is embedded in a variety of electronic apparatuses such as Personal Computers (PCs). Generally, a quartz resonator which oscillates at 32.768 kHz is used for a clock generation source of the RTC. However, the oscillation frequency of the quartz resonator which operates at 32.768 kHz is easily changed depending on a temperature. Therefore, when an oscillation frequency with further higher accuracy is similar to, for example, an RTC for a billing system or the like, it is necessary to provide a circuit which compensates for a temperature of the quartz resonator in an IC which generates clocks, and thus the costs of the IC increases.

In contrast, with regard to PCs, a low-accuracy oscillation circuit, which operates at 32.768 kHz and does not compensate for the temperature, is provided in the IC which generates clocks, and the frequency of the oscillation circuit is corrected with reference to a separate clock of a high accuracy and high speed in a system (U.S. Pat. No. 8,183,937).

However, although a correction method disclosed in U.S. Pat. No. 8,183,937 is provided to adjust the oscillation frequency of an oscillation circuit which operates at 32.768 kHz and which is embedded in an IC, the circuit size of an adjustment circuit is large, and thus the costs of the IC increase.

SUMMARY

An advantage of some aspects of the invention is to provide a clock generation device, an electronic apparatus, a moving object, and a clock generation method which can generate a clock signal having a desired frequency while the frequency varying mechanism of an oscillator or an oscillation circuit which generates a clock signal is not necessary or is simplified.

An aspect of the invention can be implemented as the following forms or application examples.

Application Example 1

This application example is directed to a clock generation device that receives a first clock signal, and generates a second clock signal which includes a predetermined number of clocks for each predetermined time by masking some clocks of the first clock signal.

In the clock generation device according to the application example, when some clocks of the first clock signal are masked, it is possible to generate the second clock signal which has a desired frequency (desired average frequency) while the frequency varying mechanism of an oscillator or an oscillation circuit is not necessary or is simplified.

Application Example 2

The clock generation device according to the application example described above may be configured such that the clock generation device includes: a clock gate unit that masks some clocks such that some clocks are not propagated, and that generates the second clock signal; a frequency measurement unit that measures a frequency ratio of the first clock signal to the second clock signal based on a third clock signal; and a mask signal generation unit that assumes that a result of the measurement performed by the frequency measurement unit is equal to a mask number of the clocks of the first clock signal, and generates a mask signal to control a mask timing of the clock gate unit according to the result of the measurement.

In the clock generation device according to this application example, the result of the measurement of the first clock signal with reference to the third clock signal is equal to the mask number and does not include errors which are generated when the mask number is calculated. Therefore, it is possible to generate the second clock signal which has frequency accuracy according to the frequency accuracy of the third clock signal.

Application Example 3

The clock generation device according to the application example described above may be configured such that the frequency measurement unit measures a difference between a given reference value and a counted value of the result of the measurement as the mask number by down counting a number of clocks of the third clock signal which is included in a time corresponding to a given number of clocks of the first clock signal.

In the clock generation device according to this application example, it is possible to calculate the mask number of the first clock signal with a simple configuration, and it is possible to effectively reduce a time where the frequency of the first clock signal is measured according to the frequency of the third clock signal.

Application Example 4

The clock generation device according to the application example described above may be configured such that the mask signal generation unit includes an accumulator which operates in synchronization with the first clock signal, and when an input signal value and an output signal value of the accumulator are respectively assumed as $y(i)$ and $y(i-1)$ and the reference value and the mask number are respectively assumed as F and K, $y(i)$ is a remainder acquired by dividing $(y(i-1)+K)$ by F, and the mask signal is a signal which uses a case in which $y(i-1)+K \geq F$ as mask timing.

In the clock generation device according to this application example, it is possible to generate the second clock signal which disperses timing where the clocks of the first clock signal are masked as evenly as possible with a simple configuration.

Application Example 5

The clock generation device according to the application example described above may be configured such that the clock generation device further includes: an oscillation circuit that generates the first clock signal and that can adjust a frequency; and a frequency adjustment unit that, when a frequency of the first clock signal is lower than a predetermined frequency, adjusts a frequency of the oscillation circuit such that the frequency of the first clock signal is equal to or higher than the predetermined frequency.

In the clock generation device according to this application example, even when the frequency of the first clock signal is lower than the predetermined frequency, it is possible to generate the second clock signal by masking some clocks of the first clock signal in such a way that the frequency of the first clock signal is caused to be equal to or higher than the predetermined frequency.

Application Example 6

The clock generation device according to the application example described above may be configured such that the clock gate unit is assumed as a first clock gate unit, the mask signal generation unit is assumed as a first mask signal generation unit, the mask signal is assumed as a first mask signal, and the clock generation device further includes: a first power terminal to which a first power voltage is supplied; a division circuit to which the third clock signal is input when the first power voltage is supplied to the first power terminal, and which generates a fourth clock signal by dividing the third clock signal using a predetermined division ratio; a second clock gate unit which masks some clocks of the fourth clock signal such that the clocks are not propagated, and generates a fifth clock signal; a second mask signal generation unit which generates a second mask signal to control a mask timing of the second clock gate unit based on information about a predetermined mask number for a predetermined number of clocks of the fourth clock signal; a clock selection unit which selects the fifth clock signal when the first power voltage is supplied to the first power terminal, and selects the second clock signal when the first power voltage is not supplied to the first power terminal; and an output terminal which outputs a clock signal selected by the clock selection unit to outside.

In the clock generation device according to this application example, it is possible to output the fifth clock signal acquired by masking some clocks of the fourth clock signal acquired by performing division on the third clock signal when the first power voltage is supplied, and it is possible to output the second clock signal when the first power voltage is not supplied. That is, in the clock generation device according to the application example, it is possible to switch over the output clock signal based on whether or not the first power voltage is supplied.

Application Example 7

The clock generation device according to the application example described above may be configured such that the accumulator is assumed as a first accumulator, and the second mask signal generation unit includes a second accumulator which operates in synchronization with the fourth clock signal, and when an input signal value and an output signal value of the second accumulator are respectively assumed as $z(i)$ and $z(i-1)$ and the predetermined number of clocks and the predetermined mask number are respectively assumed as G and L, $z(i)$ is a remainder acquired by dividing $(z(i-1)+L)$ by G, and the second mask signal is a signal which uses a case in which $z(i-1)+L \geq G$ as the mask timing.

In the clock generation device according to this application example, it is possible to generate the fifth clock signal which disperses timing where the clocks of the fourth clock signal are masked as evenly as possible with a simple configuration.

Application Example 8

The clock generation device according to the application example described above may be configured such that the clock generation device further includes: a second power terminal to which a second power voltage is supplied; and a counter which counts a number of clocks of the second clock signal, and when the second power voltage is supplied to the second power terminal, the frequency measurement unit measures a frequency of the first clock signal in such a way that the third clock signal is input whenever a counted value of the counter is a predetermined value.

In the clock generation device according to this application example, when the second power voltage is supplied, the frequency of the first clock signal is intermittently measured. Therefore, even when the supply of the first power voltage is stopped, it is possible to rapidly generate the second clock signal acquired in such a way that the frequency of the first clock signal is appropriately corrected using a result of the latest measurement. Further, even after the supply of the first power voltage is stopped, the frequency of the first clock signal is intermittently measured. Therefore, it is possible to continuously generate the second clock signal which has an approximately constant frequency by reducing the influence of the variation in the frequency of the first clock signal due to environmental change while reducing power consumption.

Application Example 9

The clock generation device according to the application example described above may be configured such that the clock generation device further includes: a division circuit that generates the first clock signal by dividing third clock signal using a predetermined division ratio; a clock gate unit that masks some clocks of the first clock signal such that the clocks are not propagated, and that generates the second clock signal; and a mask signal generation unit that generates a mask signal to control a mask timing of the clock gate unit based on information about a predetermined mask number for a predetermined number of clocks of the first clock signal.

In the clock generation device according to this application example, it is possible to generate the second clock signal with a simple configuration in which some clocks of the first clock signal acquired by dividing the third clock signal are masked.

Application Example 10

The clock generation device according to the application example described above may be configured such that the mask signal generation unit includes an accumulator which operates in synchronization with the first clock signal, and when an input signal value and an output signal value of the accumulator are respectively assumed as $z(i)$ and $z(i-1)$ and the predetermined number of clocks and the predetermined mask number are respectively assumed as G and L, $z(i)$ is a remainder acquired by dividing $(z(i-1)+L)$ by G, and the mask signal is a signal which uses a case in which $z(i-1)+L \geq G$ as the mask timing.

In the clock generation device according to this application example, it is possible to generate the second clock signal which disperses timing where the clocks of the first clock signal are masked as evenly as possible with a simple configuration.

Application Example 11

This application example is directed to an electronic apparatus which includes any of the clock generation devices described above.

Application Example 12

The electronic apparatus according to the application example described above may be configured such that the electronic apparatus further includes a real-time clock device that generates time information in synchronization with the second clock signal which is output from the clock generation device.

Application Example 13

This application example is directed to a moving object which includes any of the clock generation devices described above.

Application Example 14

This application example is directed to a clock generation method of generating a second clock signal, which has a predetermined number of clocks for each predetermined time, from a first clock signal, the clock generation method including: measuring a frequency ratio of the first clock signal to the second clock signal based on a third clock signal; assuming that a result of the measurement of the frequency ratio is equal to a mask number of the clocks of the first clock signal, and generating a mask signal according to the result of the measurement; and masking some clocks of the first clock signal such that the clocks are not propagated according to the mask signal, and generating the second clock signal.

Application Example 15

The clock generation method according to the application example described above may be configured such that, in the measuring of the frequency ratio, a difference between a given reference value and a counted value of the number of clocks is measured as the mask number by down counting a number of clocks of the third clock signal which is included in a time corresponding to a given number of clocks of the first clock signal, and, in the generating of the mask signal, an accumulator which operates in synchronization with the first clock signal is used, y(i) is a remainder acquired by dividing (y(i−1)+K) by F when an input signal value and an output signal value of the accumulator are respectively assumed as y(i) and y(i−1) and the reference value and the mask number are respectively assumed as F and K, and a mask signal is generated when y(i−1)+K≥F.

BRIEF DESCRIPTION OF THE DRAWINGS

The invention will be described with reference to the accompanying drawings, wherein like numbers reference like elements.

FIG. 4 is a diagram illustrating an example of the relationship between a measurement time, a reference value, a counted value of 25 MHz, a mask number, a correction time, and correction accuracy.

DESCRIPTION OF EXEMPLARY EMBODIMENTS

Hereinafter, preferable embodiments of the invention will be described with reference to the accompanying drawings. Meanwhile, embodiments which will be described below do not unreasonably limit the content of the invention disclosed in the appended claims. In addition, all of configurations which will be described below are not necessarily essential configurations of the invention.

1. Clock Generation Device

1-1. First Embodiment

Figure 1:
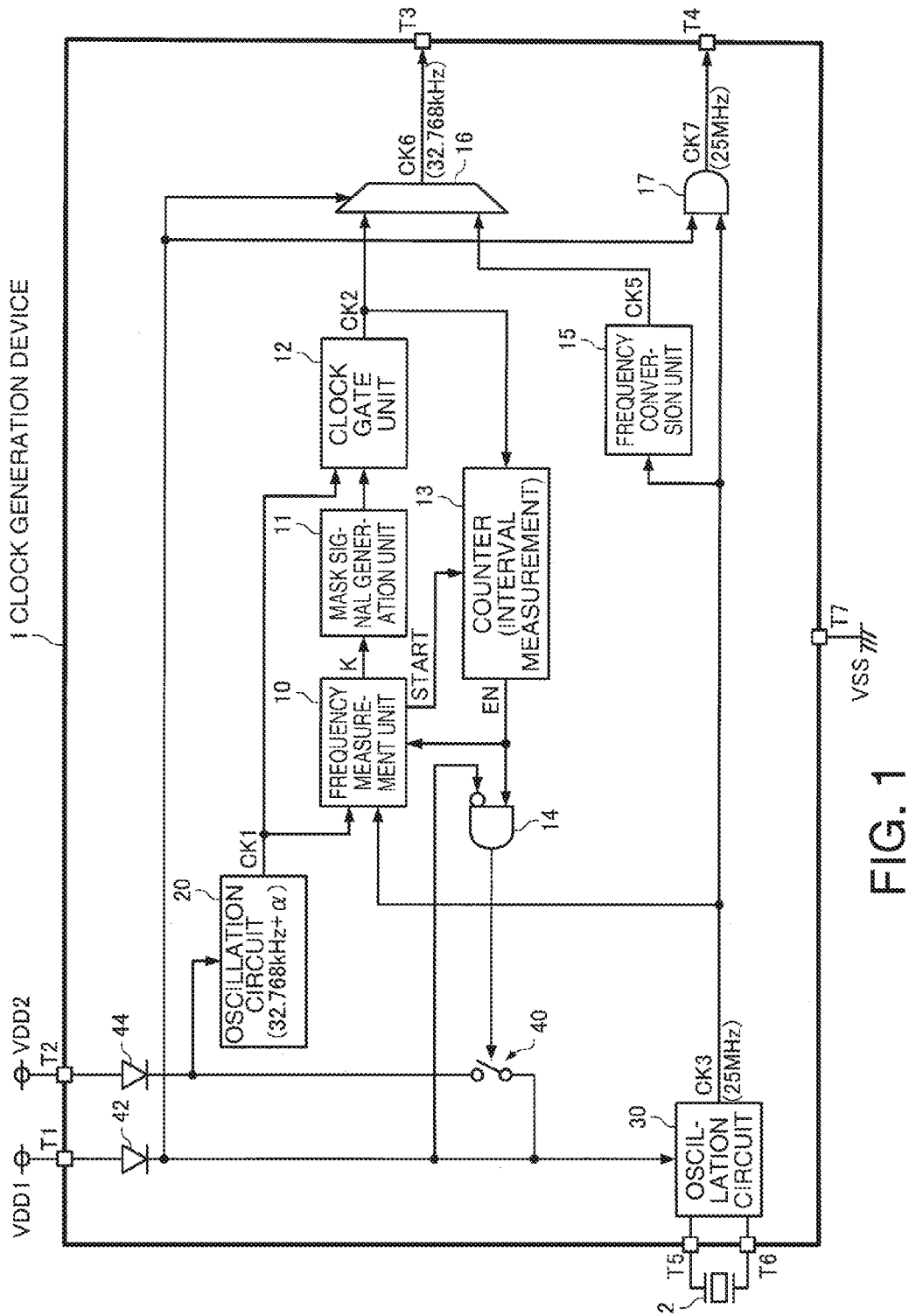
FIG. 1 is a diagram illustrating an example of the configuration of a clock generation device according to a first embodiment.

FIG. 1 is a diagram illustrating an example of the configuration of a clock generation device according to a first embodiment. A clock generation device 1 according to the first embodiment is realized as a single chip Integrated Circuit (IC) which includes a frequency measurement unit 10, a mask signal generation unit 11, a clock gate unit 12, a counter 13, an AND circuit 14, a frequency conversion unit 15, a clock selection unit 16, an AND circuit 17, an oscillation circuit 20, an oscillation circuit 30, a switch circuit 40, a diode 42, and a diode 44. However, the clock generation device 1 according to the embodiment may have a configuration in which some of components are omitted or changed, or a configuration to which another element is added.

The clock generation device 1 according to the embodiment further includes a power terminal T1 (first power terminal) which is connected to a primary power supply and to which a power voltage VDD1 (first power voltage) is supplied from the primary power supply, a power terminal T2 (second power terminal), which is connected to a secondary power supply and to which a power voltage VDD2 (second power voltage) is supplied from the secondary power supply, output terminals T3 and T4 which respectively output two clock signals CK6 and CK7, two terminals T5 and T6 which connect a quartz resonator 2, and a ground terminal T7.

The primary power supply which is connected to the terminal T1 is an AC power, a high-capacity lithium ion battery, or the like. When power of a device (for example, a note PC or a tablet PC) which includes the clock generation device 1 is shut off or in a case of power save mode, a power voltage VDD1 is not supplied to the terminal T1. On the other hand, the secondary power supply which is connected to the terminal T2 is a low-capacity coin battery or the like, and a power voltage VDD2 is normally supplied.

The oscillation circuit 20 is a circuit which operates using the power voltage VDD2 supplied from the terminal T2 via the diode 44, and which oscillates at a frequency (32.768 kHz+$\alpha$) that is higher than a predetermined frequency (in the embodiment, 32.768 kHz). The oscillation circuit 20 is realized in, for example, a CR oscillation circuit, an LC oscillation circuit, a Phase Locked Loop (PLL) circuit, a silicon Micro Electra Mechanical Systems (MEMS), and the like. In the embodiment, the oscillation circuit 20 usually oscillates at a frequency which is higher than 32.768 kHz under various conditions such as the variation in production, an operating temperature range, and an operating voltage range. For example, it is possible to consider a method of securing a large margin for a frequency in a typical condition such that the frequency is higher than 32.768 kHz even in a condition that the oscillation circuit 20 has the lowest frequency in a design stage, and a method of designing the frequency of the oscillation circuit 20 to be adjustable, securing some margins in the design stage, and individually adjusting the frequency of the oscillation circuit 20 such that the frequency is necessarily higher than 32.768 kHz even in a condition that the lowest frequency is used when a shipping inspection is performed.

The oscillation circuit 30 is connected between the terminal T5 and the terminal T6, operates with the power voltage VDD1 which is supplied from the terminal T1 via the diode 42, and causes the quartz resonator 2 to oscillate at a predetermined frequency (in the embodiment, 25 MHz). If the power voltage VDD1 is not supplied to the terminal T1, the operation of the oscillation circuit 30 is stopped during a period that the switch circuit 40 is turned off, and the oscillation circuit 30 operates with the power voltage VDD2 which is supplied from the terminal T2 via the diode 44 during a period that the switch circuit 40 is turned on.

A clock signal CK3 at 25 MHz which is output from the oscillation circuit 30 has higher frequency accuracy (lower frequency deviation) than a clock signal CK1 at 32.768 kHz+a which is output from the oscillation circuit 20, and has higher frequency stability. Here, in the embodiment, in the frequency measurement unit 10, the mask signal generation unit 11, and the clock gate unit 12, the frequency 32.768 kHz+$\alpha$ of the clock signal CK1 is measured using the clock signal CK3, and a clock signal CK2 at 32.768 kHz which is corrected depending on the results of measurement is generated.

The frequency measurement unit 10 measures a ratio of a desired frequency (32.768 kHz) to the frequency of the clock signal CK1 (first clock signal) based on the clock signal CK3 (third clock signal). The measured value is equal to the mask number of clocks of a clock signal CK1 during a time $T_{comp}$ (hereinafter, simply referred to as "correction time") which is necessary for one correction. In the embodiment, the frequency measurement unit 10 measures a ratio of a desired frequency (32.768 kHz) to the frequency of the clock signal CK1 (hereinafter, referred to as "frequency ratio measurement") only during a period that an enable signal EN, output from the counter 13 which will be described later, is input.

In particular, in the embodiment, the frequency measurement unit 10 down counts the number of clocks of the clock signal CK3 which is included in a time (measurement time $T_{meas}$) corresponding to the given number of clocks of the clock signal CK1, and thus a down counted value becomes equal to the mask number of the clocks of the clock signal CK1 in the correction time $T_{comp}$.

Figure 2:
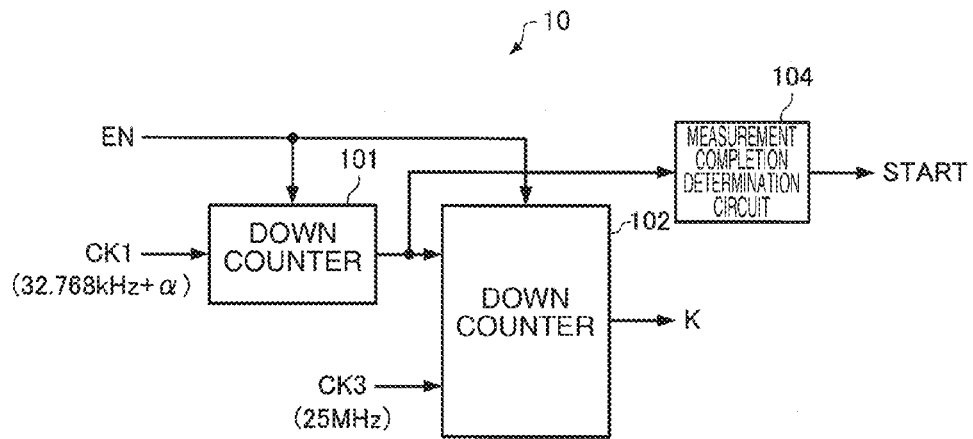
FIG. 2 is a diagram illustrating an example of the configuration of a frequency measurement unit according to the first embodiment.

FIG. 2 is a diagram illustrating an example of the configuration of the frequency measurement unit 10 according to the embodiment. In the example of FIG. 2, the frequency measurement unit 10 includes a down counter 101, a down counter 102, and a measurement completion determination circuit 104.

The down counter 101 outputs a signal at a first voltage level (low level in the embodiment) until the enable signal EN is supplied, down counts N clocks of the clock signal CK1 when the enable signal EN is supplied, and holds a time corresponding to the N clocks of the clock signal CK1 at a second voltage level (high level in the embodiment). The time that the second voltage level is held is the measurement time $T_{meas}$. For example, when N=1024, the measurement time $T_{meas}$ is a time that corresponds to the 1024 clocks of the clock signal CK1.

When the enable signal EN is supplied, the down counter 102 down counts the number of clocks of the clock signal CK3 which is input when the output signal of the down counter 101 holds the second voltage level. An initial value of the down counter 102 is a counted value (=25 MHz/ 32.768 kHz×N) acquired when a period corresponding to N cycles of 32.768 kHz is counted at 25 MHz.

When variation in the first voltage level is detected based on the second voltage level of the output signal of the down counter 101, the measurement completion determination circuit 104 generates a start signal START of the counter 13 which will be described later.

When the output signal value K (the output signal value of the down counter 102) of the frequency measurement unit 10 which is configured as described above is measured, it is possible to acquire a value which is equal to the mask number of the clocks of the clock signal CK1 for the correction time $T_{comp}$.

Figure 3A:
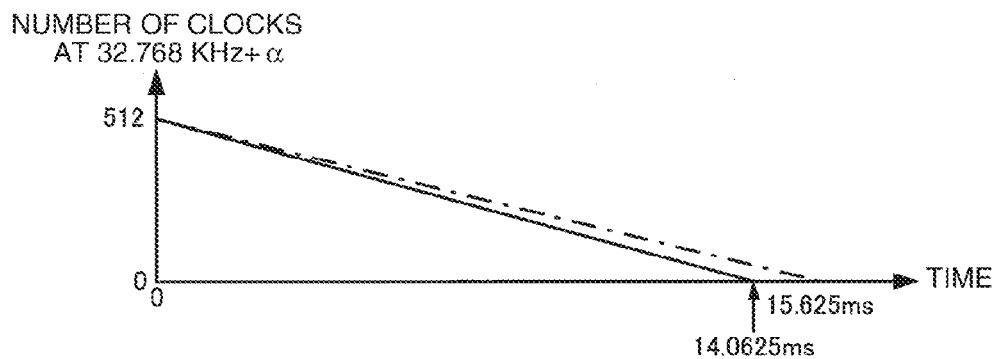
FIGS. 3A and 3B are explanation diagrams illustrating the relationship between an output signal value and a mask number of the frequency measurement unit.
Figure 3B:
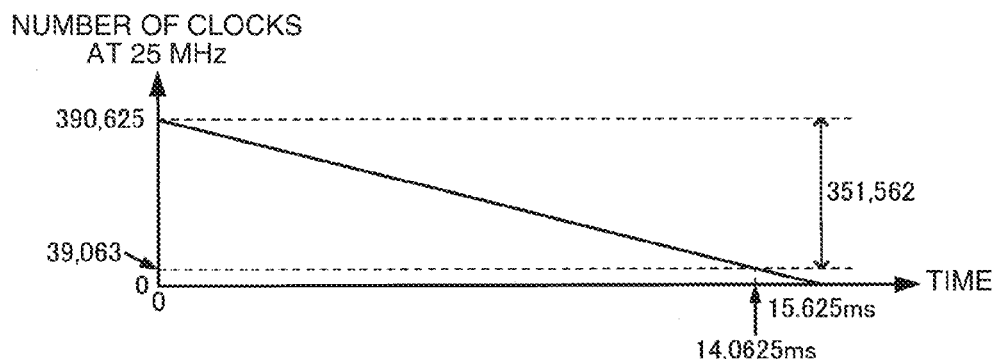

Subsequently, the relationship between the signal value K and the mask number will be described with reference to FIGS. 3A and 3B. A time that corresponds to 512 clocks at 32.768 kHz is 15.625 ms (a dashed line in FIG. 3A), and 15.625 ms is identical to a time that corresponds to 390625 clocks at 25 MHz (solid line in FIG. 3B). As above, 390625 correspond to a reference value F.

In addition, when a cycle at 32.768 kHz+$\alpha$ corresponds to the reduction of a cycle at 32.768 kHz by 10% ($\alpha$=32.768 kHz×⅑), a time that corresponds to 512 clocks at 32.768 kHz+$\alpha$ (that corresponds to the measurement time $T_{meas}$) is 14.0625 ms (solid line in FIG. 3A), and 14.0625 ms is approximately identical to the time that corresponds to 351562 clocks at 25 MHz (solid line in FIG. 3B). 351562 corresponds to a value acquired by reducing the counted value of the down counter 102 which uses 390625 (reference value F) as an initial value, and the value of the down counter 102 acquired after the measurement time $T_{meas}$ elapses is 39063 which is the difference between the initial value 390625 (reference value F) of the down counter 102 and 351562 (value acquired by reducing the counted value of the down counter 102). The value is equal to the signal value K.

On the other hand, since a cycle at 32.768 kHz+α is the reduction of a cycle at 32.768 kHz by 10%, clocks corresponding to 10% may be masked in order to correct 32.768 kHz+α to 32.768 kHz. Therefore, when the 39063 clocks (signal value K) which correspond to approximately 10% of the 390625 clocks (reference value F) at 32.768 kHz+α are masked, it is possible to correct to 32.768 kHz. That is, since the clock of the clock signal CK1 may be masked only K times for the correction time $T_{comp}$, the signal value K becomes the mask number without change.

FIG. 4 illustrates an example of the relationship between the measurement time $T_{meas}$, the reference value F, a counted value of 25 MHz, the mask number K, the correction time $T_{comp}$, and the correction accuracy. FIG. 4 illustrates an example when a cycle at 32.768 kHz+α corresponds to the reduction of a cycle at 32.768 kHz by 10% (α=32.768 kHz×⅑). For example, when it is assumed that a time that corresponds to 64 clocks of the clock signal CK1 (32.768 kHz+α) is the measurement time $T_{meas}$ (when N of down counter 101 is 64), the measurement time $T_{meas}$ is 1.7578125 ms, the reference value F is 48828, the number of counts of the clock signal CK3 (25 MHz) is 43945, the mask number K is 4883, the correction time $T_{comp}$ is 1.34 s (time that corresponds to 48828 clocks of the clock signal CK1), and the correction accuracy is 20.48 ppm. In addition, for example, when it is assumed that the time that corresponds to 512 clocks of the clock signal CK1 (32.768 kHz+α) is the measurement time $T_{meas}$ (when N of the down counter 101 is 512), the measurement time $T_{meas}$ is 14.6025 ms, the reference value F is 390625, the number of counts of the clock signal CK3 (25 MHz) is 351562, the mask number K is 39063, the correction time $T_{comp}$ is 10.73 s (time that corresponds to 390625 clocks of the clock signal CK1), and the correction accuracy is 2.56 ppm. As understood from FIG. 4, as the measurement time $T_{meas}$ is longer, the correction accuracy is higher.

Returning to FIG. 1, the mask signal generation unit 11 (first mask signal generation unit) generates a mask signal (first mask signal) used to control the mask timing of the clock gate unit 12 according to the mask number K (output signal value) which is calculated by the frequency measurement unit 10.

The clock gate unit 12 (first clock gate unit) masks some clocks of the clock signal CK1 according to the mask signal which is generated by the mask signal generation unit 11 such that some clocks of the clock signal CK1 are not propagated, and generates a clock signal CK2 (second clock signal) which has a predetermined number of clocks for each predetermined time and which has an average frequency of 32.768 kHz.

For example, if the mask signal generation unit 11 generates the mask signal which is at the high level by continuing or dispersing only the K clocks of the clock signal CK1 in the correction time $T_{comp}$ and the clock gate unit 12 is realized with a two-input AND circuit to which the clock signal CK1 and the mask signal are input, the output signal of the two-input AND circuit is the clock signal CK2 which has an average frequency of 32.768 kHz.

When the power voltage VDD1 is not supplied to the terminal T1, the clock signal CK2 which is output from the clock gate unit 12 is selected by the clock selection unit 16 and is output to the outside as a clock signal CK6 via the terminal T3. Therefore, the clock generation device 1 according to the embodiment outputs a clock signal CK6 having clocks which have some coarseness or the fineness. However, there is not a significant problem in, for example, a clocking device, such as an RTC, which clocks a time of several tens of milliseconds or several hundreds of milliseconds even though the clocking device operates with the clock signal CK6 which has some coarseness or the fineness. However, for example, when correction is necessary at an accuracy of 2.56 ppm, the correction time $T_{comp}$ is approximately 11 seconds as shown in FIG. 4. If the clocks of the clock signal CK1 are masked K times during the time, a situation in which the clock of the clock signal CK6 are stopped for approximately 1 second may occur. In this case, for example, in an analog clock which drives needles using the clock signal CK6, the needles stop for approximately 1 second. In addition, in a music reproduction device which plays an electronic melody using the clock signal CK6, a problem may occur in that the sounds of odd rhythm are instantly reproduced.

Here, in the embodiment, the mask signal generation unit 11 generates the mask signal which uniformly disperses timings that performs mask on the clocks of the clock signal CK1 as much as possible during the correction time $T_{comp}$.

Figure 5:
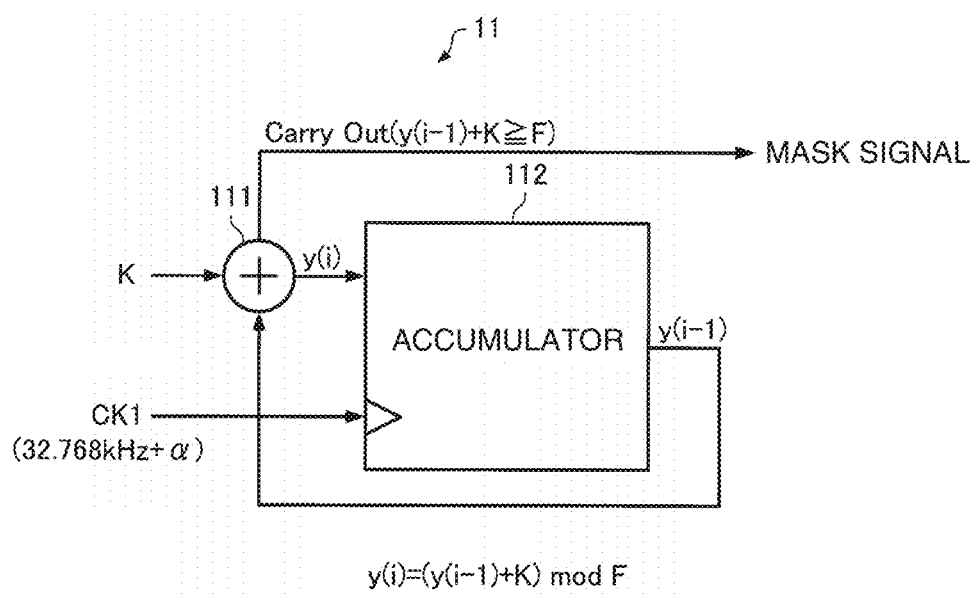
FIG. 5 is a diagram illustrating an example of the configuration of a mask signal generation unit.

FIG. 5 is a diagram illustrating an example of the configuration of the mask signal generation unit 11 according to the embodiment. In the example of FIG. 5, the mask signal generation unit 11 is configured to include an addition circuit 111 with carry-out outputs and an accumulator 112.

The addition circuit 111 adds the mask number K (the output signal value of the frequency measurement unit 10) to the output value y(i−1) of the accumulator 112, and outputs the result of addition. However, the upper limit of the output signal value y(i) of the addition circuit 111 is the reference value F−1, and y(i)=(y(i−1)+K)modF(y(i) is the remainder acquired when (y(i−1)+K) is divided by F). In addition, the addition circuit 111 generates and outputs the mask signal which is at the first voltage level (low level) when y(i−1)+K<F and which is at the second voltage level (high level) when y(i−1)+K≥F. Here, a time that corresponds to F clocks of the clock signal CK1 is the correction time $T_{comp}$, and the reference value F is set in accordance with the setting of the measurement time $T_{meas}$. Meanwhile, the value of the reference value F and the value of N which is used to determine the measurement time $T_{meas}$ may be fixed in the design stage and may be variable when the internal register is set.

The accumulator 112 (first accumulator) is a register which preserves the output signal value y(i) of the addition circuit 111 when the clock of the clock signal CK1 is input. Therefore, whenever the clock of the clock signal CK1 is input, the output signal value y(i−1) of the accumulator 112 is updated to the output signal value y(i) of the addition circuit 111.

Figure 6:
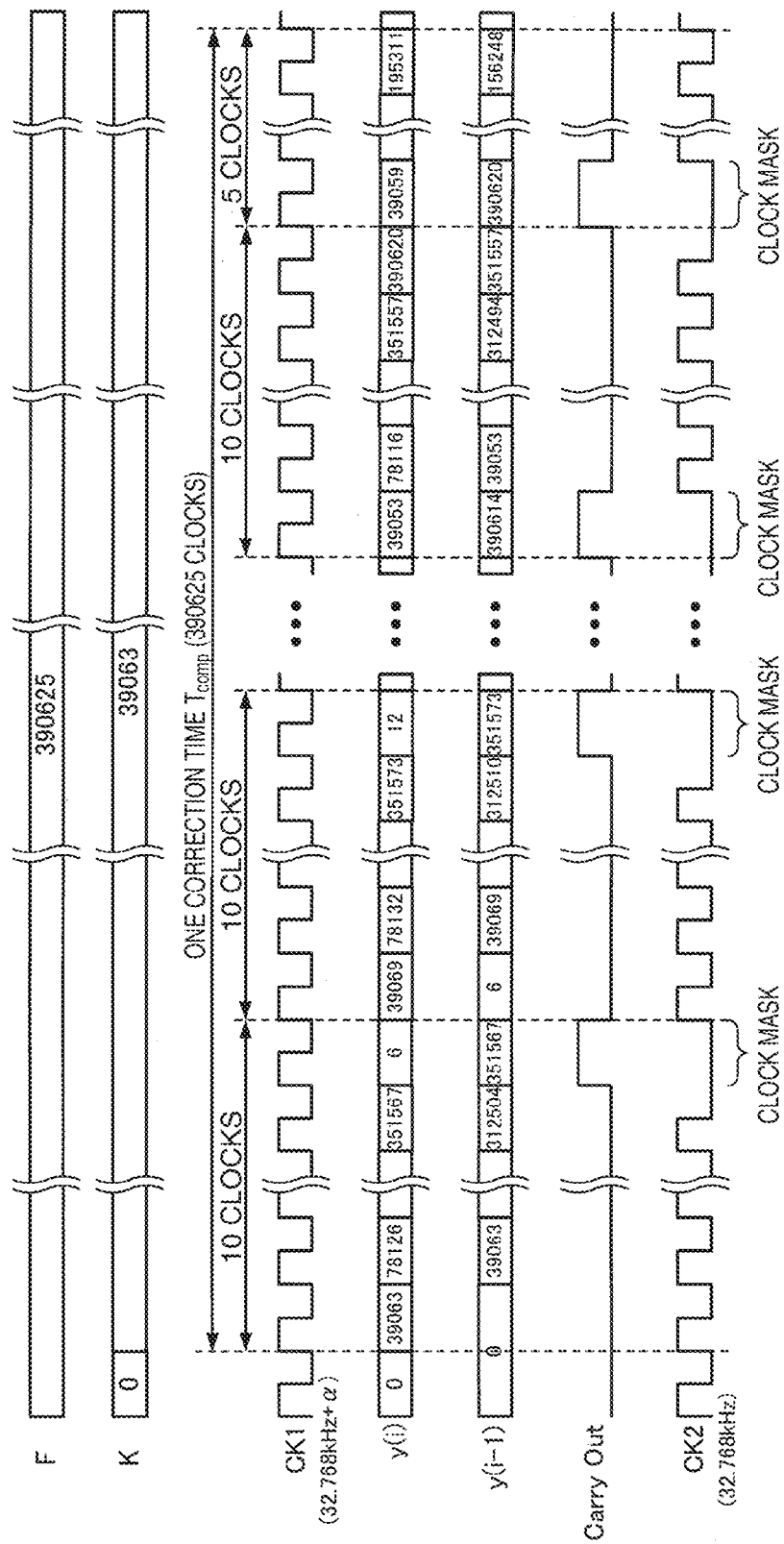
FIG. 6 is a diagram illustrating an example of a timing chart of an operation of the mask signal generation unit.

FIG. 6 shows an example of a timing chart illustrating the operation of the mask signal generation unit 11. FIG. 6 shows an example when a cycle at 32.768 kHz+α corresponds to the reduction of a cycle at 32.768 kHz by 100 (α=32.768 kHz×⅑). The measurement time $T_{meas}$ is set to a time that corresponds to the 512 clocks of the clock signal CK1, and the reference value F is set to 390625 in accordance with the clocks. That is, the correction time $T_{comp}$ is a time that corresponds to 390625 clocks of the clock signal CK1. Since the mask number K (the output signal value of the frequency measurement unit 10) is 39063, 39063 clocks (10%) of the 390625 clocks of the clock signal CK1 are masked during the correction time $T_{comp}$. As shown in FIG. 6, the clock signal CK1 has one masked clock for each ten clocks, and thus it is understood that it is possible to disperse the clock mask timing at approximately equal distances with the simple configuration as shown in FIG. 5.

When a first correction (correction time $T_{comp}$) ends, the clock generation device 1 according to the embodiment performs second correction during the correction time $T_{comp}$ which is the same as in the first correction using K which has the same value as in the first correction. Thereafter, similarly, the same correction is repeated until subsequent frequency ratio measurement is performed. Further, after the previous frequency ratio measurement is performed, the clock generation device 1 newly performs the frequency ratio measurement when a predetermined interval time $T_{int}$ elapses, and updates the signal value K.

Returning to FIG. 1, the counter 13 counts the number of clocks of the clock signal CK2 which is output from the clock gate unit 12, thereby measuring the interval time $T_{int}$ and supplying the enable signal EN to the frequency measurement unit 10 whenever the interval time $T_{int}$ is measured. More specifically, when a start signal START (the output signal of the measurement completion determination circuit 104) is supplied from the frequency measurement unit 10, the counter 13 starts counting the number of clocks of the clock signal CK2, and generates the enable signal EN when the counted value reaches a set value. The period which is counted by the counter 13 corresponds to the interval time $T_{int}$, and the set value of the interval time $T_{int}$ is appropriately set in consideration of an environmental condition, the permission range of correction errors, and the like. Meanwhile, the value of the interval time $T_{int}$ may be fixed in the design stage and may be variable when the internal register is set.

Further, the frequency measurement unit 10 receives the enable signal EN at every interval time $T_{int}$, and intermittently performs the frequency ratio measurement.

Figure 7A:
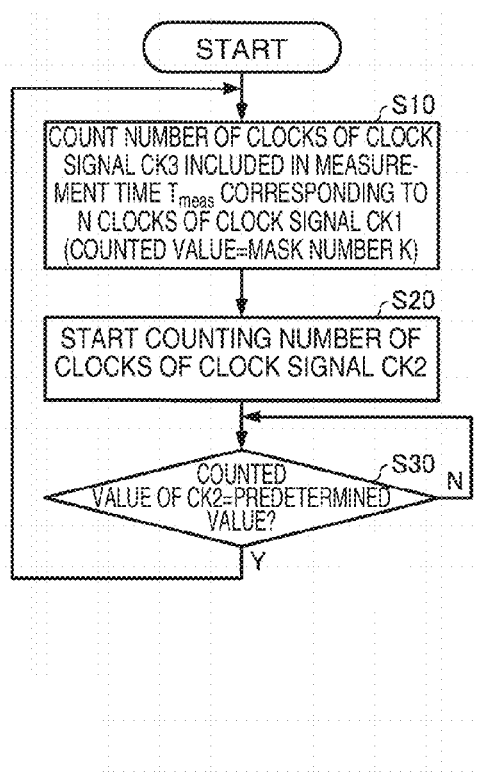
FIGS. 7A and 7B are flowcharts illustrating a mask signal generation process according to the first embodiment.
Figure 7B:
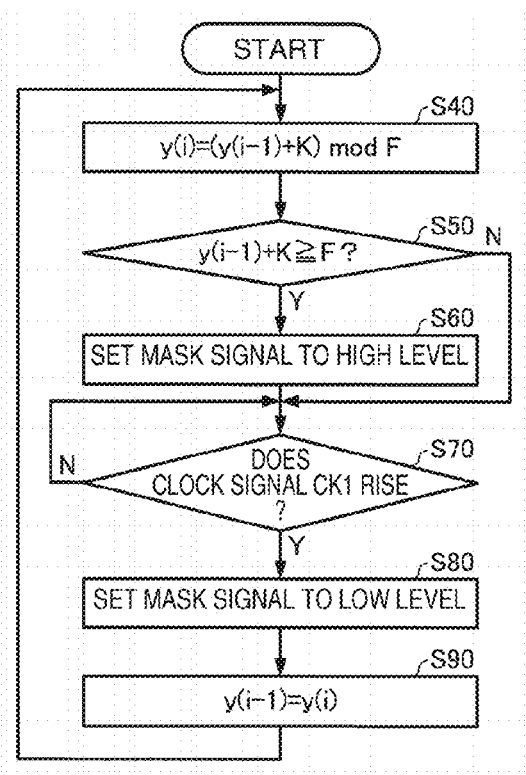

FIGS. 7A and 7B are flowcharts illustrating the mask signal generation process which is described so far. FIG. 7A is a flowchart illustrating frequency ratio measurement, and FIG. 7B is a flowchart illustrating frequency correction. The frequency ratio measurement and the frequency correction are performed in parallel.

In the flowchart shown in FIG. 7A which illustrates the frequency ratio measurement, the clock generation device 1, first, counts the number of clocks of the clock signal CK3, which are included in the measurement time $T_{meas}$ that corresponds to the N clocks of the clock signal CK1 (S10). The counted value acquired here is equal to the mask number K.

Subsequently, the clock generation device 1 starts counting the number of clocks of the clock signal CK2 (S20).

Further, the clock generation device 1 repeatedly performs the processes insteps S10 and S20 whenever the counted value of the number of clocks of the clock signal CK2, the counting being started in step S20, matches the predetermined value (that is, the interval time $T_{int}$ elapses) (Y in S30).

In the flowchart shown in FIG. 7B which illustrates the frequency correction, the clock generation device 1, first, calculates y(i)=(y(i−1)+K)modF using the output value y(i−1) of the accumulator 112, the mask number K (the latest mask number K which is acquired in step S10 of FIG. 7A), and the reference value F (S40).

Subsequently, if y(i−1)+K≥F (Y in S50), the clock generation device 1 sets the mask signal to the high level (S60), sets the mask signal to the low level (S80) at a timing of the subsequent rising edge of the clock signal CK1 (Y in S70), and updates the output value y(i−1) of the accumulator 112 to y(i) (S90).

On the other hand, if y (i−1)+K<F (N in S50), the clock generation device 1 maintains the mask signal at the low level (S80) at the timing of the subsequent rising edge of the clock signal CK1 (Y in S70), and updates the output value y(i−1) of the accumulator 112 to y(i) (S90).

Further, the clock generation device 1 repeatedly performs the process in steps S40 to S90 using the latest mask number K which is acquired in step S10 of FIG. 7A.

Returning to FIG. 1, the enable signal EN is supplied to the non-inverted input of the AND circuit 14, and a voltage of the terminal T1 is supplied to the inverted input of the AND circuit 14 via the diode 42. Therefore, the AND circuit 14 usually outputs a signal at the low level when the power voltage VDD1 is supplied to the terminal T1, outputs a signal at the high level during a period that the enable signal EN is supplied when the power voltage VDD1 is not supplied to the terminal T1, and outputs the signal at the low level other than the period.

The output signal of the AND circuit 14 is supplied to the control input of the switch circuit 40, and the switch circuit 40 is on (electrically connects between two terminals) when the output signal of the AND circuit 14 is at the high level, and is off (electrically shut off between two terminals) when the output signal is at the low level.

Therefore, when the power voltage VDD1 is supplied to the terminal T1, the switch circuit 40 is usually off, with the result that the power voltage VDD2 is not supplied to the oscillation circuit 30 and only the power voltage VDD1 is supplied, and thus the clock signal CK3 is output. In contrast, when the power voltage VDD1 is not supplied to the terminal T1, the power voltage VDD2 is supplied to the oscillation circuit 30 only during a period that the frequency measurement unit 10 performs measurement (period that the enable signal EN is supplied), and thus the clock signal CK3 is output.

Figure 8:
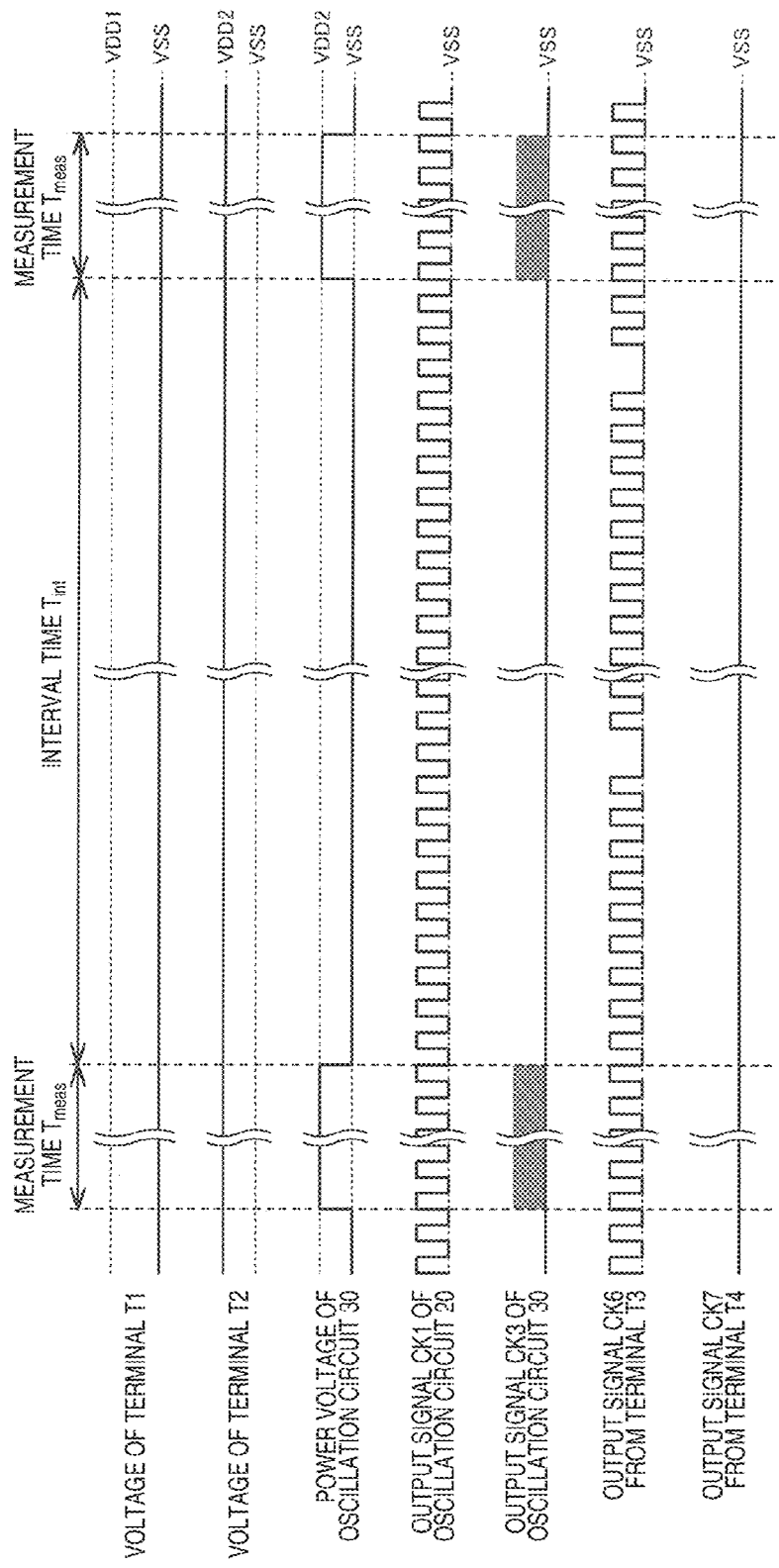
FIG. 8 is a diagram illustrating an example of a timing chart acquired when a power voltage is not supplied from a primary power supply.

When the power voltage VDD1 is supplied to the terminal T1, the clock signal CK3 passes through the AND circuit 17 and is output to the outside as the clock signal CK7 via the terminal T4. In contrast, when the power voltage VDD1 is not supplied to the terminal T1, the clock signal CK3 which is generated for the measurement period of the frequency measurement unit 10 is masked in the AND circuit 17 and is not output to the outside. FIG. 8 shows an example of a timing chart when the power voltage VDD1 is not supplied to the terminal T1.

When the power voltage VDD1 is supplied to the terminal T1, the frequency conversion unit 15 performs frequency conversion on the clock signal CK3, and generates a clock signal CK5, the average frequency of which is a predetermined frequency (in the embodiment, 32.768 kHz).

The frequency conversion unit 15 may generate a clock signal which has an average frequency of 32.768 kHz by dividing the clock signal CK3 while a plurality of division ratios are switched over using a division circuit which has various division ratios. For example, 481 times of 763 division and 31 times of 762 division are sequentially repeated for the clock signal CK3, and thus the clock signal CK5 which has an average frequency of 32.768 kHz is acquired.

Figure 9:
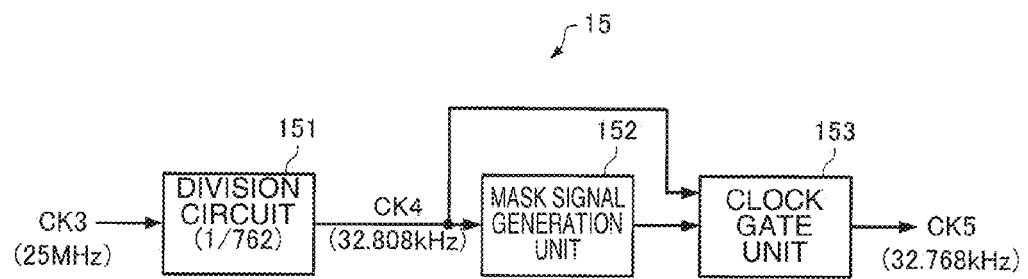
FIG. 9 is a diagram illustrating an example of the configuration of a frequency conversion unit.

Alternatively, the frequency conversion unit 15 may include a configuration as shown in FIG. 9. In an example of FIG. 9, the frequency conversion unit 15 is configured to include a division circuit 151, a mask signal generation unit 152, and a clock gate unit 153. The division circuit 151 receives an input of the clock signal CK3 (third clock signal), and generates clock signal CK4 (fourth clock signal) having a frequency which is higher than 32.768 kHz by dividing the clock signal CK3 by a predetermined division ratio. In the embodiment, the division circuit 151 generates a clock signal CK4 of 32.808 kHz (=25 MHz/762) by performing 762 division on the clock signal CK3.

The mask signal generation unit 152 (second mask signal generation unit) generates a mask signal (second mask signal) to control the mask timing of the clock gate unit 153 based on information about a predetermined mask number for a predetermined number of clocks of the clock signal CK4.

The clock gate unit 153 (second clock gate unit) performs mask such that some clocks of the output clock signal CK4 of the division circuit 151 are not propagated according to the mask signal generated by the mask signal generation unit 152, and generates the clock signal CK5 (fifth clock signal) which has an average frequency of 32.768 kHz.

For example, the number of clocks of a 32.768 kHz, which are included in a time that corresponds to 390625 clocks of 32.808 kHz is 390144, and the difference therebetween is 481. Therefore, for example, the mask signal generation unit 152 may generate a mask signal used to mask 481 clocks for 390625 clocks of the clock signal CK4, and the clock gate unit 153 may be realized with a two-input AND circuit to which the clock signal CK4 and the mask signal are input.

Figure 10:
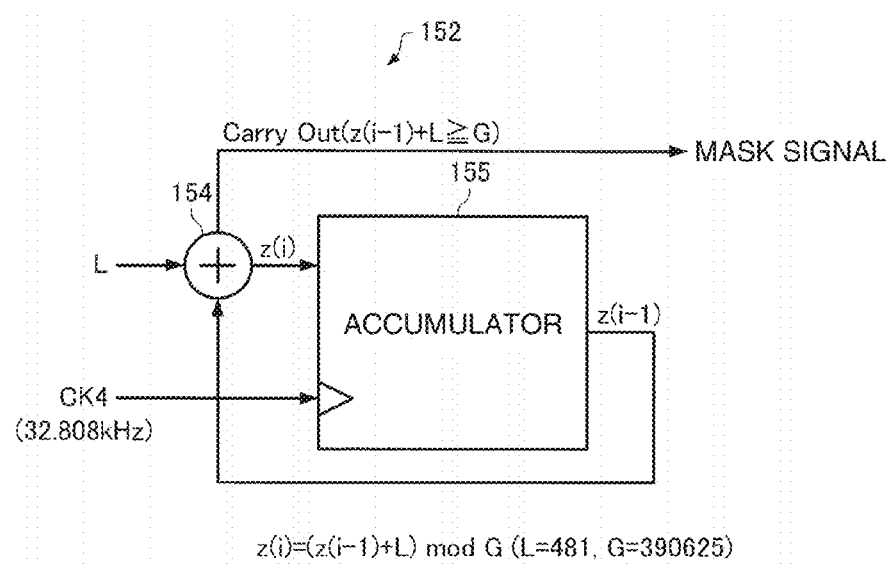
FIG. 10 is a diagram illustrating an example of the configuration of a mask signal generation unit.

In the embodiment, similar to the mask signal generation unit 11, the mask signal generation unit 152 generates a mask signal which disperses timing where the clocks of the clock signal CK4 are masked as evenly as possible. FIG. 10 shows an example of the configuration of the mask signal generation unit 152 according to the embodiment. In the example of FIG. 10, the mask signal generation unit 152 is configured to include an addition circuit 154 with carry-out output and an accumulator 155.

The addition circuit 154 adds a predetermined value L to the output value $y(i-1)$ of the accumulator 155, and outputs the result. However, the upper limit of the output signal value $z(i)$ of the addition circuit 154 is G−1, and $z(i)=(z(i-1)+L)modG(z(i)$ is a remainder acquired by dividing $(z(i-1)+L)$ by G). In addition, the addition circuit 154 generates and outputs a mask signal which is at the first voltage level (low level) when $z(i-1)+L<G$ and which is at the second voltage level (high level) when $z(i-1)+L≥G$. Here, for example, the predetermined value L is a mask number for G clocks of the clock signal CK4. When G is 390625, L is 481. Meanwhile, the value of L and the value of G may be fixed in the design stage, and may be modifiable when the internal register is set.

The accumulator 155 (second accumulator) is a register which preserves the output signal value $z(i)$ of the addition circuit 154 when the clock of the division clock signal CK4 is input. Therefore, whenever the clock of the division clock signal CK4 is input, the output signal value $z(i-1)$ of the accumulator 155 is updated to the output signal value $z(i)$ of the addition circuit 154.

Figure 11:
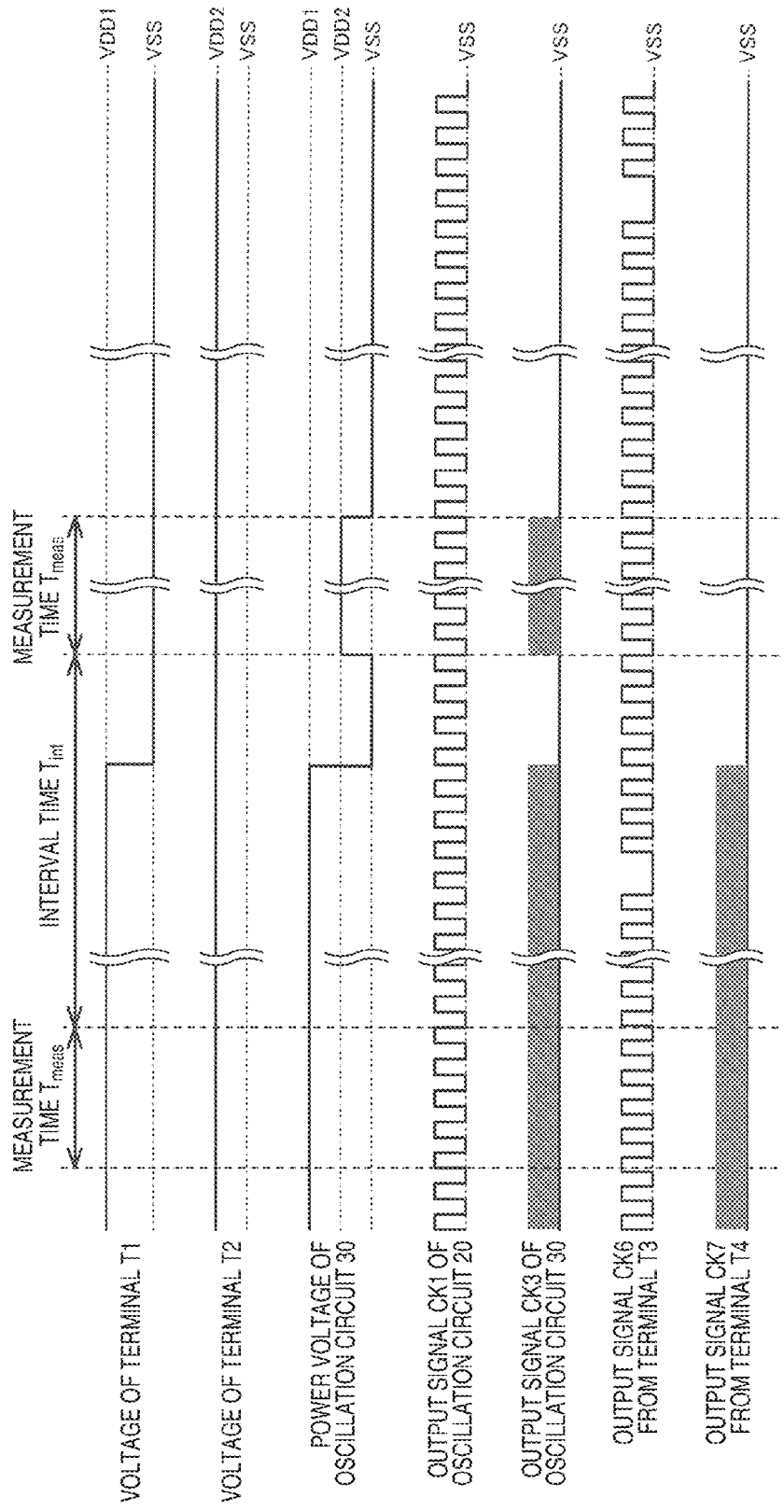
FIG. 11 is a diagram illustrating an example of a timing chart acquired before and after the supply of the power voltage from the primary power supply is stopped.

In the clock generation device 1 according to the embodiment, the clock signal CK5 which is output from the clock gate unit 153 is selected by the clock selection unit 16 when the power voltage VDD1 is being supplied to the terminal T1, and is output to the outside as the clock signal CK6 through the terminal T3. In addition, as described above, when the power voltage VDD1 is not supplied to the terminal T1, the clock signal CK2 which is output from the clock gate unit 12 is selected by the clock selection unit 16, and is output to the outside as the clock signal CK6 through the terminal T3. FIG. 11 shows an example of a timing chart illustrating the operation of the clock generation device 1 before and after the supply of the power voltage VDD1 to the terminal T1 is stopped. Meanwhile, since it is not known when the supply of the power voltage VDD1 from the primary power supply is stopped in the embodiment, the oscillation operation of the oscillation circuit 20 is normally continued, and the frequency ratio of the clock signal CK1 is intermittently measured by the frequency measurement unit 10 even when the power voltage VDD1 is supplied.

As described above, according to the clock generation device of the first embodiment, some clocks of the clock signal CK1 which is higher than 32.768 kHz are masked. Therefore, it is possible to generate the clock signal CK2 which has an average frequency of 32.768 kHz while it is not necessary to adjust the frequency of the oscillation circuit 20.

In addition, according to the clock generation device of the first embodiment, the mask number K of the clock signal CK1 is directly measured on the basis of the clock signal CK3, and thus it is possible to generate the clock signal CK2 which has high frequency accuracy according to the frequency accuracy of the clock signal CK3.

In addition, according to the clock generation device of the first embodiment, it is possible to directly calculate the mask number K of the clock signal CK1 with a simple configuration by counting the number of clocks of the clock signal CK3 included in a time corresponding to the predetermined clocks of the clock signal CK1, and it is possible to gain desired correction accuracy with reduction in the measurement time using the clock signal CK3 which has sufficiently high frequency compared to the clock signal CK1.

In addition, according to the clock generation device of the first embodiment, it is possible to generate the clock signal CK2 which disperses timing where the clocks of the clock signal CK1 are masked as evenly as possible with a simple configuration by configuring the mask signal generation unit 11 using the addition circuit 111 and the accumulator 112.

In addition, according to the clock generation device of the first embodiment, since the clock signal CK5 which is directly generated from the clock signal CK3 is selected and output when the power voltage VDD1 is supplied to the terminal T1, it is possible to output a clock signal at 32.768 kHz which has higher frequency accuracy than the clock signal CK2. On the other hand, even when the power voltage VDD1 is not supplied to the terminal T1, it is possible to select the clock signal CK2 which is generated from the clock signal CK1 and output a clock signal at 32.768 kHz while the power voltage VDD2 which is normally supplied to the terminal T2 is used as the power voltage.

In addition, according to the clock generation device of the first embodiment, it is possible to generate the clock signal CK5 which disperses timing where the clocks of the clock signal CK4 are masked as evenly as possible with simple configuration by configuring the mask signal generation unit 152 using the addition circuit 154 and the accumulator 155.

In addition, according to the clock generation device of the first embodiment, since the frequency of the clock signal CK1 is intermittently measured if the power voltage VDD2 is supplied, it is possible to rapidly generate the clock signal CK2 which is acquired in such a way that frequency correction is appropriately performed on the clock signal CK1 using the latest measurement result regardless of when the supply of the power voltage VDD1 is stopped. Further, since the frequency of the clock signal CK1 is intermittently measured after the supply of the power voltage VDD1 is stopped, it is possible to reduce the influence of variation in the frequency of the clock signal CK1 due to environmental change and to continuously generate the clock signal CK2 which has approximately uniform frequency while reducing power consumption.

1-2. Second Embodiment

Figure 12:
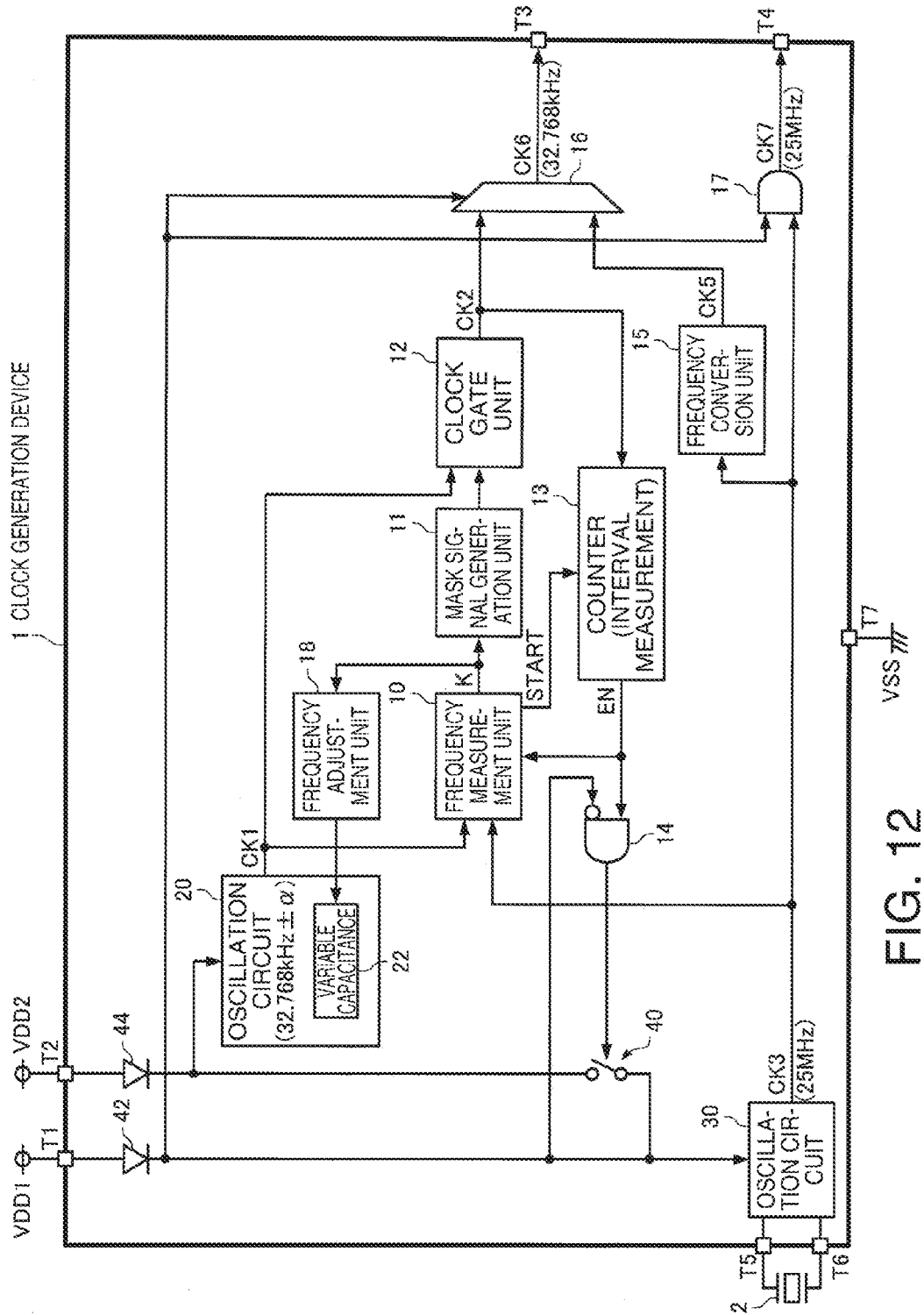
FIG. 12 is a diagram illustrating an example of the configuration of a clock generation device according to a second embodiment.

FIG. 12 is a diagram illustrating an example of the configuration of a clock generation device according to a second embodiment. Similar to the first embodiment, a clock generation device 1 according to the second embodiment is realized as a single chip Integrated Circuit (IC) which includes a frequency measurement unit 10, a mask signal generation unit 11, a clock gate unit 12, a counter 13, an AND circuit 14, a frequency conversion unit 15, a clock selection unit 16, an AND circuit 17, an oscillation circuit 20, an oscillation circuit 30, a switch circuit 40, a diode 42, a diode 44, and a frequency adjustment unit 18. However, the clock generation device 1 according to the embodiment may have a configuration in which some of the elements are omitted or changed or to which another element is added.

In the clock generation device 1 according to the second embodiment, the oscillation circuit 20 includes a variable capacitance 22 which is a part of a load capacitance when oscillation is performed, and the capacitance value of the variable capacitance 22 changes according to a control signal which is output from the frequency adjustment unit 18. If the capacitance value of the variable capacitance 22 becomes small, the frequency of the oscillation circuit 20 (the frequency of the clock signal CK1) becomes high. The variable capacitance 22 may be realized with, for example, one or more variable capacitance elements (variable capacitance diodes, and the like), and may be realized with a capacitance array which is configured from a plurality of fixed capacitance elements and a plurality of switches.

Unlike the first embodiment, in the clock generation device 1 according to the second embodiment, the oscillation circuit 20 may not necessarily oscillate at a frequency which is higher than 32.768 kHz, and may oscillate at a frequency which is equal to or lower than 32.768 kHz under some or all of conditions, such as variation in production, an operating temperature range, and an operating voltage range. Therefore, for example, the frequency of the oscillation circuit 20 may be individually adjusted such that a frequency of a typical condition is designed to be close to 32.768 kHz in the design stage or such that the frequency is close to 32.768 kHz at an operating voltage or a temperature which is the basis when shipping inspection is performed.

The frequency adjustment unit 18 determines whether a frequency (32.768 kHz±α) of the clock signal CK1 which is output from the oscillation circuit 20 is higher or lower than a predetermined frequency (32.768 kHz). When the frequency is lower than the predetermined frequency, the frequency adjustment unit 18 adjusts the frequency of the oscillation circuit 20 such that the frequency of the clock signal CK1 is equal to or higher than the predetermined frequency (32.768 kHz or higher). More specifically, if the mask number K (an output signal value of the frequency measurement unit 10) is a negative value, the frequency adjustment unit 18 causes the frequency of the oscillation circuit 20 to be high by performing control such that the capacitance value of the variable capacitance 22 becomes small. Further, the frequency adjustment unit 18 does not change the capacitance value of the variable capacitance 22 if the mask number K is 0 or a positive value.

Although the frequency measurement unit 10 according to the second embodiment is the same as in the first embodiment with regard to basic operations, the frequency measurement unit 10 does not end the frequency ratio measurement and performs the frequency ratio measurement again when the mask number K is a negative value (when the frequency of the oscillation circuit 20 is lower than 32.768 kHz). After a first frequency ratio measurement ends, the adjustment is performed by the frequency adjustment unit 18 such that the frequency of the oscillation circuit 20 becomes high. Therefore, the mask number K is greater in the second frequency ratio measurement than the first frequency ratio measurement. Further, the frequency measurement unit 10 repeats the frequency ratio measurement until the mask number K becomes 0 or a positive value. Meanwhile, the frequency measurement unit 10 can determine whether the mask number K is 0, a positive value (borrow signal is not output), or a negative value (borrow signal is output) based on whether or not the non-sufficient signal (borrow signal) of a digit, which is output when the down counter 102 moves from 0 to the maximum value, is generated.

Meanwhile, although an example in which the frequency of the oscillation circuit 20 is controlled by a variable capacitance is shown, the invention is not limited thereto. The frequency may be controlled by other circuit elements (for example, resistors) or by a power voltage value.

Figure 13:
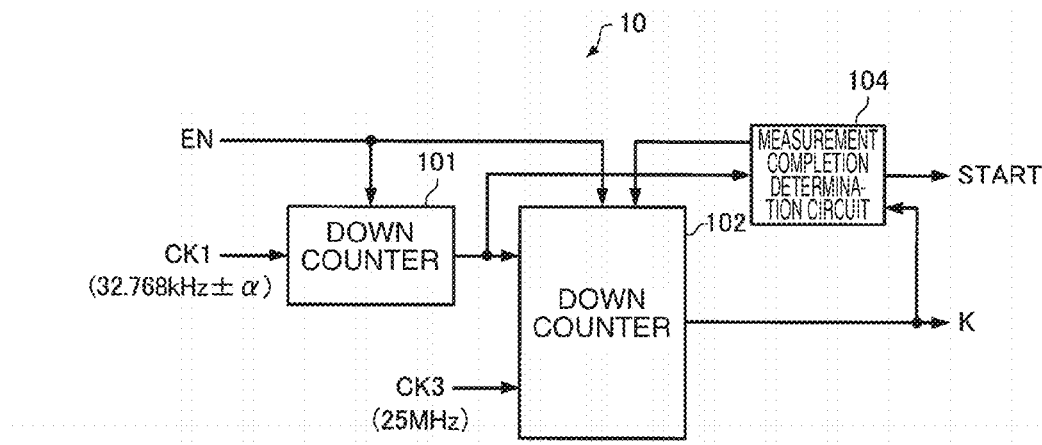
FIG. 13 is a diagram illustrating an example of the configuration of a frequency measurement unit according to the second embodiment.

FIG. 13 is a view illustrating an example of the configuration of the frequency measurement unit 10 according to the second embodiment. In the example of FIG. 12, the frequency measurement unit 10 is configured to include a down counter 101, a down counter 102, a subtraction circuit 103, and a measurement completion determination circuit 104 similar to FIG. 2. The operations of the down counter 101 and the subtraction circuit 103 are the same as in the first embodiment.

When an enable signal EN is supplied, the down counter 102 down counts the number of clocks of the clock signal CK1 which is input during a period (measurement time $T_{meas}$) that the output signal of the down counter 101 holds the first voltage level (low level) or the second voltage level (high level).

The measurement completion determination circuit 104 generates the start signal START of the counter 13 in FIG. 12 when a borrow signal is not generated from down counting at a point of time where change in the output signal of the down counter 101 from the second voltage level to the first voltage level or change from the first voltage level to the second voltage level is detected (corresponds to a case in which the mask number K is 0 or a positive value). In contrast, when the borrow signal is generated (the frequency of the oscillation circuit 20 is lower than 32.768 kHz), the start signal START is not generated and the down counter 102 is reset. Therefore, if the mask number K is 0 or a positive value at the point of time where the frequency ratio measurement is completed, an operation performed by the frequency measurement unit 10 is stopped and measurement of the interval time $T_{int}$ is started by the counter 13. If the mask number K is a negative value, subsequent frequency ratio measurement is started by the frequency measurement unit 10 and the measurement of the interval time $T_{int}$ is not started by the counter 13.

When the mask number K is a negative value, the frequency adjustment unit 18 may perform control, for example, such that the capacitance value of the variable capacitance 22 decreases as much as predetermined amount, or may control the capacitance value of the variable capacitance 22 in accordance with the mask number K such that the frequency of the oscillation circuit 20 is necessarily 32.768 kHz or higher. In the former case, it is possible to simplify design. However, there is a problem in that the number of repetitions of the frequency ratio measurement performed by the frequency measurement unit 10 becomes large. In the latter case, design is complicated. However, it is possible to eliminate the repetitions of the frequency ratio measurement performed by the frequency measurement unit 10.

Since other configurations of the clock generation device 1 according to the second embodiment are the same as in the first embodiment, the descriptions thereof are not repeated.

Figures 14A, 14B:
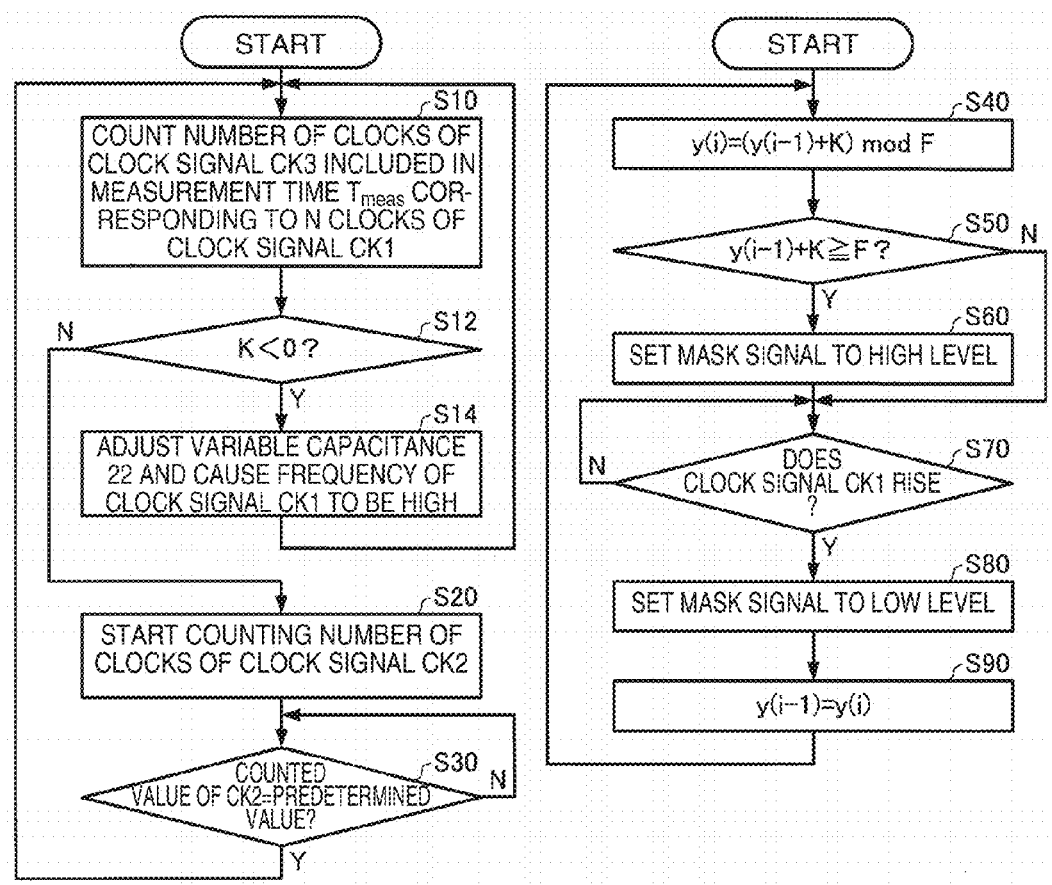
FIGS. 14A and 14B are flowcharts illustrating a mask signal generation process according to the second embodiment.

FIGS. 14A and 14B are flowcharts illustrating a mask signal generation process according to the second embodiment. FIG. 14A is a flowchart illustrating the frequency ratio measurement and FIG. 14B is a flowchart illustrating frequency correction. The frequency ratio measurement and the frequency correction are performed in parallel. In FIGS. 14A and 14B, the same reference numerals are used to indicate the respective steps in which the same processes are performed as in FIGS. 7A and 7B.

In the frequency ratio measurement flowchart shown in FIG. 14A, the clock generation device 1 first performs a measurement process in step S10 as in the first embodiment (FIG. 7A).

Subsequently, the clock generation device 1 determines whether or not the mask number K is a negative value (S12). If the mask number K is not a negative value (N in S12), a process subsequent to step S20 is performed the same as in the first embodiment (FIG. 7A).

In contrast, if the mask number K is the negative value (Y in S12), the clock generation device 1 adjusts the variable capacitance 22 to cause the frequency of the clock signal CK1 to be high (S14), and performs the measurement process in steps S10 and S20 again. Further, the clock generation device 1 repeatedly performs processes in steps S14 and S10 until the mask number K is 0 or a positive value. If the mask number K is 0 or a positive value (Y in S12), the process subsequent to step S20 is performed as the same as in the first embodiment (FIG. 7A).

Meanwhile, since the frequency correction flowchart shown in FIG. 14B is the same as in the first embodiment (FIG. 7B), the description thereof will not be repeated.

As described above, according to the clock generation device of the second embodiment, when the frequency of the clock signal CK1 which is output from the oscillation circuit 20 is higher than 32.768 kHz, some clocks of the clock signal CK1 are masked, and thus it is possible to generate a clock signal CK2 which has an average frequency of 32.768 kHz. In contrast, when the frequency of the clock signal CK1 is lower than 32.768 kHz, some clocks of the clock signal CK1 are masked by adjusting the frequency of the oscillation circuit 20 to be equal to or higher than 32.768 kHz, and thus it is possible to generate the clock signal CK2 which has an average frequency of 32.768 kHz. Therefore, since the oscillation circuit 20 may not necessarily oscillate at a frequency which is higher than 32.768 kHz, it is easy to design the oscillation circuit 20. In addition, when the frequency of the clock signal CK1 is lower than 32.768 kHz, the frequency of the clock signal CK1 may be a frequency which is equal to or higher than 32.768 kHz. Therefore, high accuracy is not necessary to adjust the frequency of the oscillation circuit 20, and thus it is possible to simplify frequency adjustment.

In addition thereto, it is possible for the clock generation device according to the second embodiment to acquire the same advantage as the above-described clock generation device according to the first embodiment.

2. Electronic Apparatus

Figure 15:
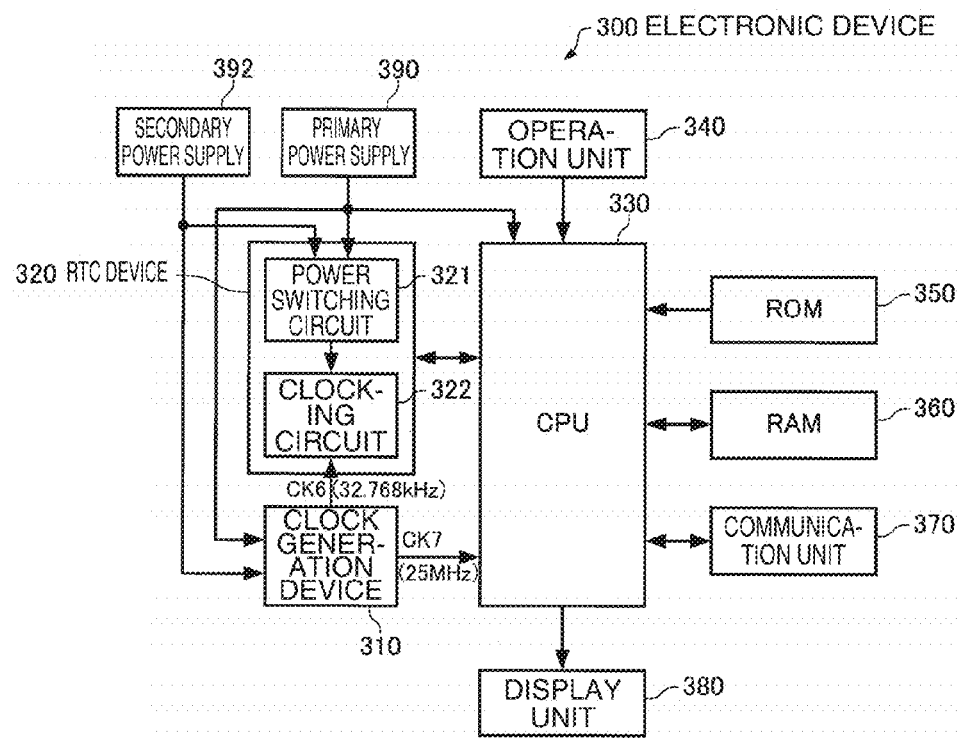
FIG. 15 is a functional block diagram illustrating an electronic apparatus according to the embodiment.
Figure 16:
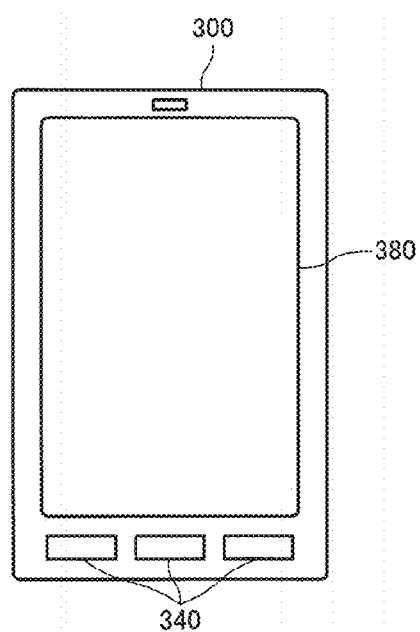
FIG. 16 is a view illustrating an example of the appearance of the electronic apparatus according to the embodiment.

FIG. 15 is a functional block diagram illustrating an electronic apparatus of the embodiment. In addition, FIG. 16 is a view illustrating an example of the appearance of a moving object communication device which is an example of the electronic apparatus of the embodiment.

An electronic apparatus 300 of the embodiment is configured to include a clock generation device 310, a real-time clock (RTC) device 320, a Central Processing Unit (CPU) 330, an operation unit 340, a Read Only Memory (ROM) 350, a Random. Access Memory (RAM) 360, a communication unit 370, a display unit 380, a primary power supply 390, and a secondary power supply 392. Meanwhile, the electronic apparatus according to the embodiment may have a configuration in which some of components (respective units) of FIG. 15 are omitted or changed, or a configuration to which another element is added.

The primary power supply 390 is, for example, power, such as a lithium-ion battery, which is built in the electronic apparatus 300, or an external AC power or the like of the electronic apparatus 300. The secondary power supply 392 is, for example, power, such as a coin battery, which is built in the electronic apparatus 300.

The clock generation device 310 is, for example, the clock generation device 1 according to the above-described first embodiment or the second embodiment. As described above, the clock generation device 310 simultaneously outputs a clock signal CK6 (32.768 kHz) and a clock signal CK7 (25 MHz) when the power voltage of the primary power supply 390 is supplied, and the clock generation device 310 outputs the clock signal CK6 (32.768 kHz) and does not output the clock signal CK7 (25 MHz) when the power voltage of the primary power supply 390 is not supplied.

The real-time clock device 320 is, for example, an one-chip IC which includes a power switching circuit 321 and a clocking circuit 322 to which the output voltage of the power switching circuit 321 is supplied as the power voltage. The power switching circuit 321 supplies the power voltage of the primary power supply 390 to the clocking circuit 322 when the power voltage of the primary power supply 390 is supplied, and the power switching circuit 321 switches the power voltage which is supplied to the clocking circuit 322 to the power voltage of the secondary power supply 392 when the power voltage of the primary power supply 390 is not supplied. The clocking circuit 322 performs a clocking process in synchronization with the clock signal CK6 which is output from the clock generation device 310.

The CPU 330 is operated by the primary power supply 390, and performs various calculation processes and control processes in accordance with a program which is stored in the ROM 350 or the like. More specifically, the CPU 330 performs various processes in accordance with an operating signal from the operation unit 340, a process to control the communication unit 370 in order to perform data communication with outside, and a process to transmit a display signal in order to display various information to the display unit 380 in synchronization with the clock signal CK7 which is output from the clock generation device 310.

The operation unit 340 is an input device which is configured from operating keys, button switches, and the like, and outputs an operating signal to the CPU 330 in accordance with an operation performed by a user.

The ROM 350 stores programs, data, and the like such that the CPU 330 performs various calculation processes or a control process.

The RAM 360 is used as the operating area of the CPU 330, and temporarily stores programs and data which are read from the ROM 350, data which is input from the operation unit 340, the result of operation performed by the CPU 330 in accordance with various programs, and the like.

The communication unit 370 performs various controls in order to establish data communication between the CPU 330 and an external device.

The display unit 380 is a display device which is configured from a Liquid Crystal Display (LCD) or the like, and displays various information based on a display signal which is input from the CPU 330. A touch panel which functions as the operation unit 340 may be provided in the display unit 380.

It is possible to realize a highly reliable electronic apparatus with lower costs by embedding the clock generation device 1 according to the embodiment as the clock generation device 310.

Various electronic apparatuses may be considered as such an electronic apparatus 300. For example, a personal computer (for example, a mobile-type personal computer, a laptop-type personal computer, a note-type personal computer, or a tablet-type personal computer), a moving object terminal such as a mobile telephone, a digital still camera, an ink jet type discharging device (for example, an ink jet printer), a storage area network device, such as a router, a switch, or the like, a local area network device, a television, a video camera, a video tape recorder, a car navigation device, a pager, an electronic organizer (including a communication function), an electronic dictionary, a calculator, an electronic game device, a game controller, a word processor, a work station, a television phone, a television monitor for preventing crimes, an electronic binoculars, a POS terminal, a medical device (for example, an electronic thermometer, a manometer, a blood sugar monitoring system, an electrocardiogram measurement device, an ultrasonic diagnostic device, or an electronic meters (for example, meters of a vehicle, an airplane, and a ship), a flight simulator, a head-mounted display, a motion trace, a motion tracking, a motion controller, a Pedestrian Dead Reckoning (PDR), and the like may be exemplified.

3. Moving Object

Figure 17:
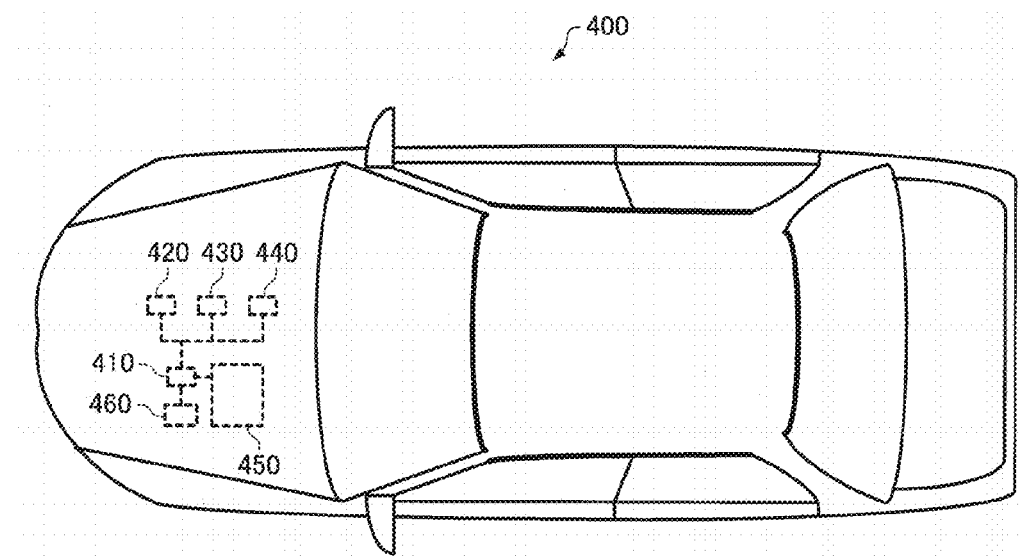
FIG. 17 is a view illustrating an example of a moving object according to the embodiment.

FIG. 17 is a view (top view) illustrating an example of a moving object according to the embodiment. A moving object 400 shown in FIG. 17 is configured to include a clock generation device 410, controllers 420, 430, and 440 which perform various control on an engine system, a brake system, a keyless entry system, and the like in synchronization with various clock signals which are output from the clock generation device 410, a battery 450, and a backup battery 460. Meanwhile, the moving object according to the embodiment may have a configuration in which some of components (respective units) shown in FIG. 17 are omitted or changed, or a configuration to which another element is added.

It is possible to use the clock generation device 1 according to each of the above-described embodiments as the clock generation device 410, and thus it is possible to secure higher reliability.

Various moving objects may be considered as such a moving object 400. For example, a vehicle (including an electric vehicle), an airplane, such as a jet airplane or a helicopter, a ship, a rocket, an artificial satellite, and the like may be exemplified.

4. Modification Example

The invention is not limited to the embodiment, and various modification examples are possible without departing the gist of the invention.

For example, in the embodiment, the clock generation device 1 which is realized with a single IC is described as an example. However, the clock generation device 1 may be realized with a plurality of ICs, and may be realized in such a way that a plurality of discrete components corresponding to the plurality of components of the clock generation device 1 are connected to a board through the wiring.

In addition, for example, in the clock generation device 1 according to the embodiment, the clock signal CK5 is selected as the clock signal CK6 when the power voltage VDD1 of the primary power supply is supplied, and the clock signal CK2 is selected as the clock signal CK6 and is output to the outside when the power voltage VDD1 of the primary power supply is not supplied. However, the clock generation device 1 may usually output the clock signal CK2 (corresponding to the second clock signal) which is generated by masking some of the clocks of the clock signal CK1 (corresponding to the first clock signal) to the outside. In this case, the frequency conversion unit 15 and the clock selection unit 16 may not be used. Alternately, the clock generation device 1 may usually output the clock signal CK5 (corresponding to the second clock signal) which is generated by masking some of the clocks of the division clock signal CK4 (corresponding to the first clock signal) acquired by dividing the clock signal CK3 by the division circuit 151 to the outside. In this case, the frequency measurement unit 10, the mask signal generation unit 11, the clock gate unit 12, the counter 13, the AND circuit 14, the clock selection unit 16, the oscillation circuit 20, the switch circuit 40, the diode 44 and the terminal T2 may not be used.

Each of the above-described embodiments and the modification example are examples and the invention is not limited thereto. For example, it is possible to appropriately combine each of the above-described embodiments and the modification example.

The invention includes a configuration which is substantially the same as the configuration which is described in the embodiments (for example, a configuration which has the same functions, methods, and results, or a configuration which has the same object and advantage). In addition, the invention includes a configuration which is acquired by replacing non-essential parts of the configuration which is described in the embodiments. In addition, the invention includes a configuration which shows the same effect as the configuration which is described in the embodiments or a configuration which can gain the same object. In addition, the invention includes a configuration acquired by adding a well-known technology to the configuration which is described in the embodiment.

The entire disclosure of Japanese Patent Application No. 2013-064186 filed Mar. 26, 2013 is expressly incorporated by reference herein.

What is claimed is:

1. A clock generation device that receives a first clock signal, and generates a second clock signal which includes a predetermined number of clocks for each predetermined time by masking some clocks of the first clock signal, the clock generation device comprising:

a frequency measurement unit that measures a frequency ratio of the first clock signal to the second clock signal based on a third clock signal, wherein the frequency measurement unit measures a difference between a given reference value and a counted value of the result of the measurement as a mask number of the clocks of the first clock signal by down counting a number of clocks of the third clock signal which is included in a time corresponding to a given number of clocks of the first clock signal.

2. The clock generation device according to claim 1, comprising:
   a clock gate unit that masks some clocks such that the clocks are not propagated, and that generates the second clock signal; and
   a mask signal generation unit that assumes that a result of the measurement performed by the frequency measurement unit is equal to the mask number of the clocks of the first clock signal, and generates a mask signal to control a mask timing of the clock gate unit according to the result of the measurement.

3. The clock generation device according to claim 2, wherein the mask signal generation unit includes an accumulator which operates in synchronization with the first clock signal,
   wherein, when an input signal value and an output signal value of the accumulator are respectively assumed as $y(i)$ and $y(i-1)$ and the reference value and the mask number are respectively assumed as F and K, $y(i)$ is a remainder acquired by dividing $(y(i-1)+K)$ by F, and
   wherein the mask signal is a signal which uses a case in which $y(i-1)+K \neq F$ as a mask timing.

4. The clock generation device according to claim 3, wherein the clock gate unit is assumed as a first clock gate unit,
   wherein the mask signal generation unit is assumed as a first mask signal generation unit,
   wherein the mask signal is assumed as a first mask signal, and
   wherein the clock generation device further comprises:
     a first power terminal to which a first power voltage is supplied;
     a division circuit to which the third clock signal is input when the first power voltage is supplied to the first power terminal, and which generates a fourth clock signal by dividing the third clock signal using a predetermined division ratio;
     a second clock gate unit which masks some clocks of the fourth clock signal such that the clocks are not propagated, and generates a fifth clock signal;
     a second mask signal generation unit which generates a second mask signal to control a mask timing of the second clock gate unit based on information about a predetermined mask number for a predetermined number of clocks of the fourth clock signal;
     a clock selection unit which selects the fifth clock signal when the first power voltage is supplied to the first power terminal, and selects the second clock signal when the first power voltage is not supplied to the first power terminal; and
     an output terminal which outputs a clock signal selected by the clock selection unit to outside.

5. The clock generation device according to claim 4, wherein the accumulator is assumed as a first accumulator,
   wherein the second mask signal generation unit includes a second accumulator which operates in synchronization with the fourth clock signal,
   wherein, when an input signal value and an output signal value of the second accumulator are respectively assumed as $z(i)$ and $z(i-1)$ and the predetermined number of clocks and the predetermined mask number are respectively assumed as G and L, $z(i)$ is a remainder acquired by dividing $(z(i-1)+L)$ by G, and
   wherein the second mask signal is a signal which uses a case in which $z(i-1)+L \neq G$ as the mask timing.

6. The clock generation device according to claim 4, further comprising:
   a second power terminal to which a second power voltage is supplied; and
   a counter which counts a number of clocks of the second clock signal,
   wherein, when the second power voltage is supplied to the second power terminal, the frequency measurement unit measures a frequency of the first clock signal in such a way that the third clock signal is input whenever a counted value of the counter is a predetermined value.

7. An electronic apparatus comprising the clock generation device according to claim 3.

8. The clock generation device according to claim 2, further comprising:
   an oscillation circuit that generates the first clock signal and that can adjust a frequency; and
   a frequency adjustment unit that, when a frequency of the first clock signal is lower than a predetermined frequency, adjusts a frequency of the oscillation circuit such that the frequency of the first clock signal is equal to or higher than the predetermined frequency.

9. An electronic apparatus comprising the clock generation device according to claim 2.

10. A moving object comprising the clock generation device according to claim 2.

11. The clock generation device according to claim 1, further comprising:
    a division circuit that generates the first clock signal by dividing third clock signal using a predetermined division ratio;
    a clock gate unit that masks some clocks of the first clock signal such that the clocks are not propagated, and that generates the second clock signal; and
    a mask signal generation unit that generates a mask signal to control a mask timing of the clock gate unit based on information about a predetermined mask number for a predetermined number of clocks of the first clock signal.

12. The clock generation device according to claim 11, wherein the mask signal generation unit includes an accumulator which operates in synchronization with the first clock signal,
    wherein, when an input signal value and an output signal value of the accumulator are respectively assumed as $z(i)$ and $z(i-1)$ and the predetermined number of clocks and the predetermined mask number are respectively assumed as G and L, $z(i)$ is a remainder acquired by dividing $(z(i-1)+L)$ by G, and
    wherein the mask signal is a signal which uses a case in which $z(i-1)+L \neq G$ as the mask timing.

13. An electronic apparatus comprising the clock generation device according to claim 1.

14. The electronic apparatus according to claim 13, further comprising:

a real-time clock device that generates time information in synchronization with the second clock signal which is output from the clock generation device.

15. A moving object comprising the clock generation device according to claim 1.

16. A clock generation method of generating a second clock signal, which has a predetermined number of clocks for each predetermined time, from a first clock signal, the clock generation method comprising:
   measuring a frequency ratio of the first clock signal to the second clock signal based on a third clock signal;
   assuming that a result of the measurement of the frequency ratio is equal to a mask number of the clocks of the first clock signal, and generating a mask signal according to the result of the measurement; and
   masking some clocks of the first clock signal such that the clocks are not propagated according to the mask signal, and generating the second clock signal,
wherein, in the measuring of the frequency ratio, a difference between a given reference value and a counted value of the number of clocks is measured as the mask number by down counting a number of clocks of the third clock signal which is included in a time corresponding to a given number of clocks of the first clock signal.

17. The clock generation method according to claim 16, wherein, in the generating of the mask signal, an accumulator which operates in synchronization with the first clock signal is used, $y(i)$ is a remainder acquired by dividing $(y(i-1)+K)$ by $F$ when an input signal value and an output signal value of the accumulator are respectively assumed as $y(i)$ and $y(i-1)$ and the reference value and the mask number are respectively assumed as $F$ and $K$, and a mask signal is generated when $y(i-1)+K \neq F$.

* * * * *